United States Patent
Ishizuka et al.

(10) Patent No.: US 6,617,949 B2
(45) Date of Patent: Sep. 9, 2003

(54) CHOKE COIL

(75) Inventors: Atsushi Ishizuka, Nagano-ken (JP);
Masami Miyamoto, Nagano-ken (JP);
Masami Nonaka, Nagano-ken (JP);
Tadashi Sato, Nagano-ken (JP)

(73) Assignee: FDK Corporation, Tokyo (JP)

( * ) Notice: Subject to any disclaimer, the term of this patent is extended or adjusted under 35 U.S.C. 154(b) by 0 days.

(21) Appl. No.: 10/235,161

(22) Filed: Sep. 5, 2002

(65) Prior Publication Data

US 2003/0043007 A1 Mar. 6, 2003

(30) Foreign Application Priority Data

Sep. 5, 2001 (JP) ......................................... 2001-268909

(51) Int. Cl.⁷ ............................................. H01F 27/28
(52) U.S. Cl. ........................ 336/183; 336/170; 336/206; 336/222
(58) Field of Search ................................. 336/180–184, 336/206–208, 220, 222, 224, 170

(56) References Cited

U.S. PATENT DOCUMENTS 3,579,165 A * 5/1971 Johnson ...................... 336/183
4,635,019 A * 1/1987 Akachi et al. ............... 336/180
5,422,619 A * 6/1995 Yamaguchi et al. ......... 336/184

FOREIGN PATENT DOCUMENTS

JP   2-178905   * 7/1990

* cited by examiner

Primary Examiner—Tuyen T. Nguyen
(74) Attorney, Agent, or Firm—Harness, Dickey & Pierce, P.L.C.

(57) ABSTRACT

A choke coil has small difference of wire wound resistances between coils to obtain sufficient unbalance attenuation amount, superior in workability in winding and reduced leakage inductance and line capacity. The choke coil includes first and second coils divided into first and second segments wound on a single spool disposing intermediate insulations layers between respectively adjacent coil segments. The coil segments of the first and second coils are wound alternately. The first coil segment of the first coil and the second coil segment of the second coil being wound in a first winding number and the second coil segment of the second coil and the first coil segment of the second coil being wound in a second winding number. The second winding number being greater than the first winding number for reducing difference of winding resistance between the first and second coils less than or equal to 4%.

6 Claims, 4 Drawing Sheets

$n11 = n22 < n12 = n21$
$d2 > d1$

CHOKE COIL

CROSS-REFERENCE TO RELATED APPLICATIONS

The present application claims priority based on Japanese Patent Application No. 2001-268909 filed on Sep. 5, 2001, the contents of which are herein incorporated by reference.

BACKGROUND OF THE INVENTION

1. Field of the Invention

The present invention relates generally to a choke coil having a coil pair having winding ratio of 1:1. More particularly, the invention relates to a choke coil to be effectively used in a band-pass filter used as inserted in a transmission line balanced with respect to the ground, such as a telephone circuit and so forth.

2. Description of the Related Art

For example, in ADSL (Asymmetric Digital Subscriber Line) in which superimposed a high speed digital signal on a telephone circuit, a branching filter called as splitter is employed for separating a telephone signal and a digital signal. The branching filter is constructed with an LPF (low-pass filter) selectively passing a frequency band of the telephone signal and an HPF (high-pass filter) selectively passing a frequency band of the digital signal.

On the other hand, the telephone circuit, in which the branching filter is used, is typically a transmission line balanced with respect to the ground. Upon forming a BPF (band-pass filter), such as LPF, HPF and the like, it is essential to certainly achieve unbalance attenuation amount with respect to the ground in order to restrict adverse effect of potential fluctuation in a grounding layer and loop noise with the ground.

As shown by winding structure and equivalent circuits of a choke coil in FIGS. 4A, 4B, 4C and 4D, 4E and 4F, a choke coil is constituted by winding a coil pair L1 and L2 in one coil with a winding ratio of 1:1. Both coils L1 and L2 are wound on a common core (magnetic core) in a single coil bobbin. Various winding structures may be employed as shown in FIGS. 4A to 4F.

The coil shown in FIG. 4A includes a first coil L1 and a second coil L2 forming the coil pair having winding ratio of 1:1. The first and second coils L1 and L2 are wound inside and outside separated by an intermediate insulation layer 2. The first coil L1 is wound predetermined turns n1 inside of the intermediate insulation layer 2. On the other hand, the second coil L2 is wound predetermined turns n2 (n1=n2) outside of the intermediate insulation layer 2. By this, the choke coil having the coil pair L1 and L2 having winding ratio of n1:n2=1:1, is formed. It should be noted that outermost side of the coil is covered with an insulation layer 29.

The coil shown in FIG. 4B includes the first and second coils L1 and L2 having predetermined turns n1 and n2. Respective first and second coils L1 and L2 are dividedly wound the predetermined turns n1 and n2 into two coil segments respectively having number of turns half of the predetermined turns n1 and n2. From inside to outside, a first coil segment L11 of the first coil L1, a first coil segment L21 of the second coil L2, a second coil segment L12 of the first coil L1 and a second coil segment L22 of the second coil L2 are sequentially wound in sequentially stacked manner. Between respectively adjacent coil segments L11, L21, L12 and L22, intermediate insulation layers 2 are interposed for insulation therebetween. Winding numbers n11, n21, n12 and n22 of the coil segments L11, L21, L12 and L22 are the same (n11=n21=n12=n22) as each other. By this, the coil pair L1 and L2 having the winding ratio 1:1 is formed.

The coil shown in FIG. 4C also includes the first and second coils L1 and L2, wherein the first coil L1 is separated into the first coil segment L11 and the second coil segment L12 which are arranged on innermost side and outermost side. Between the first and second coil segments L11 and L12 of the first coil L1, the first and second coil segments L21 and L22 of the second coil L2 are wound simultaneously.

The coil shown in FIG. 4D has a partitioning wall portion 11 dividing a spool portion of the coil bobbin 1 into two sections. In respective sections, the first and second coils L1 and L2 are separately wound by the predetermined turns n1 and n2 (n1=n2).

The coil shown in FIG. 4E is also provided with the partitioning wall portion 11 dividing the spool of the coil bobbin 1 into two sections. In one of the divided spool sections, the first coil segment L11 of the first coil L1 and the first coil segment L21 of the second coil L2 are wound in stacking manner with insulation by the intermediate insulation layer 2. In the other divided spool section, the second coil segment L12 of the first coil L1 and the second coil segment L22 of the second coil L2 are wound in stacking manner with insulation by the intermediate insulation layer 2.

In the coil shown in FIG. 4F, the first coil L1 and the second coil L2 are simultaneously wound by respectively predetermined turns n1 and n2 (n1=n2).

As set forth above, there have been proposed various manners of winding in the common mode choke coil.

In the conventional choke coil set forth above, the inventors have found the following problems to be encountered.

Namely, in case of the coils shown in FIGS. 4A and 4B, while number of turns n1 and n2 of the first and second coils L1 and L2 are the same with each other to have 1:1 of winding ratio, difference of wire wound resistances due to difference of winding diameters of the first and second coils L1 and L2 is significant to cause difficulty in obtaining sufficient unbalance attenuation amount with respect to the ground.

In case of the coil shown in FIG. 4C, the first and second coils L1 and L2 are divided into two segments, respectively. The first and second coil segments L21 and L22 of the second coil L2 are simultaneously wound. Therefore, winding operation is complicated and difficult to increase process steps.

In case of the coils shown in FIGS. 4D and 4E, the bobbin provided with the partitioning wall portion 11 dividing the spool into two sections becomes necessary. Furthermore, in comparison with the divided winding structure (so-called sandwich structure) of coaxially stacking manner shown in FIG. 4A or 4B, a leakage inductance between the first and second coils L1 and L2 becomes large. If the leakage inductance becomes large, when the band-pass filter, such as LPF or the like is formed, good transmission characteristics cannot be obtained in a pass frequency band (pass band).

In case of the coil shown in FIG. 4F, line capacity between the first and second coils L1 and L2 becomes large. When the line capacity becomes large, if the band-pass filter is formed, good attenuation characteristics cannot be obtained at a blocking frequency band (out of pass-band).

As set forth above, the aforementioned conventional choke coils cause problems in unbalance attenuation amount with respect to the ground, workability in winding, leakage inductance, line capacity and so forth. Conventionally, it is quite difficult to clear up all of the problems set forth above.

SUMMARY OF THE INVENTION

The present invention has been worked out in view of the above and other problems. Therefore, it is an object of the present invention to provide a choke coil which has small difference of wire wound resistances between coils to obtain sufficient unbalance attenuation amount, has superior in workability in winding and reduce leakage inductance and line capacity.

According to one aspect of the present invention, a choke coil including a coil pair having a winding ratio of 1:1, comprises:

first and second coils forming the coil pair, respective of the first and second coils being divided into first and second segments wound on a single spool disposing intermediate insulations layers between respectively adjacent coil segments, the first and second coil segments being stackingly wound in sequential order of the first coil segment of the first coil, the first coil segment of the second coil, the second coil segment of the first coil and the second coil segment of the second coil from inside to outside, the first coil segment of the first coil and the second coil segment of the second coil being wound in a first winding number and the second coil segment of the second coil and the first coil segment of the second coil being wound in a second winding number, the second winding number being greater than the first winding number for reducing difference of winding resistance between the first and second coils less than or equal to 4%.

A thickness of the intermediate insulation layer disposed between the first coil segment of the second coil and the second coil segment of the first coil may be adjusted for adjusting the difference of winding resistance between the first and second coils less than or equal to 4%.

Thicknesses of the insulation layers may be set to be different from each other so as to establish the difference of winding resistance between the first and second coils less than or equal to 4%. For example, a thickness of an insulation layer disposed between the first coil segment of the second coil and the second coil segment of the first coil may be differentiated from thicknesses of insulation layers respectively disposed between the first coil segment of the first coil and the first coil segment of the second coil and between the second coil segment of the first coil and the second coil segment of the second coil. Also, the intermediate insulation layer may be formed by winding an insulation tape for adjusting the difference of winding resistance between the first and second coils less than or equal to 4% by thickness and/or winding number of the insulation tape.

A common mode choke coil constructed is particularly effective for providing good characteristics for a band-pass filter to be inserted in a transmission line balanced with respect to the ground.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DETAILED DESCRIPTION OF THE INVENTION

The present invention will be discussed hereinafter in detail in terms of the preferred embodiment, a choke coil of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscurity of the present invention.

Figure 1:
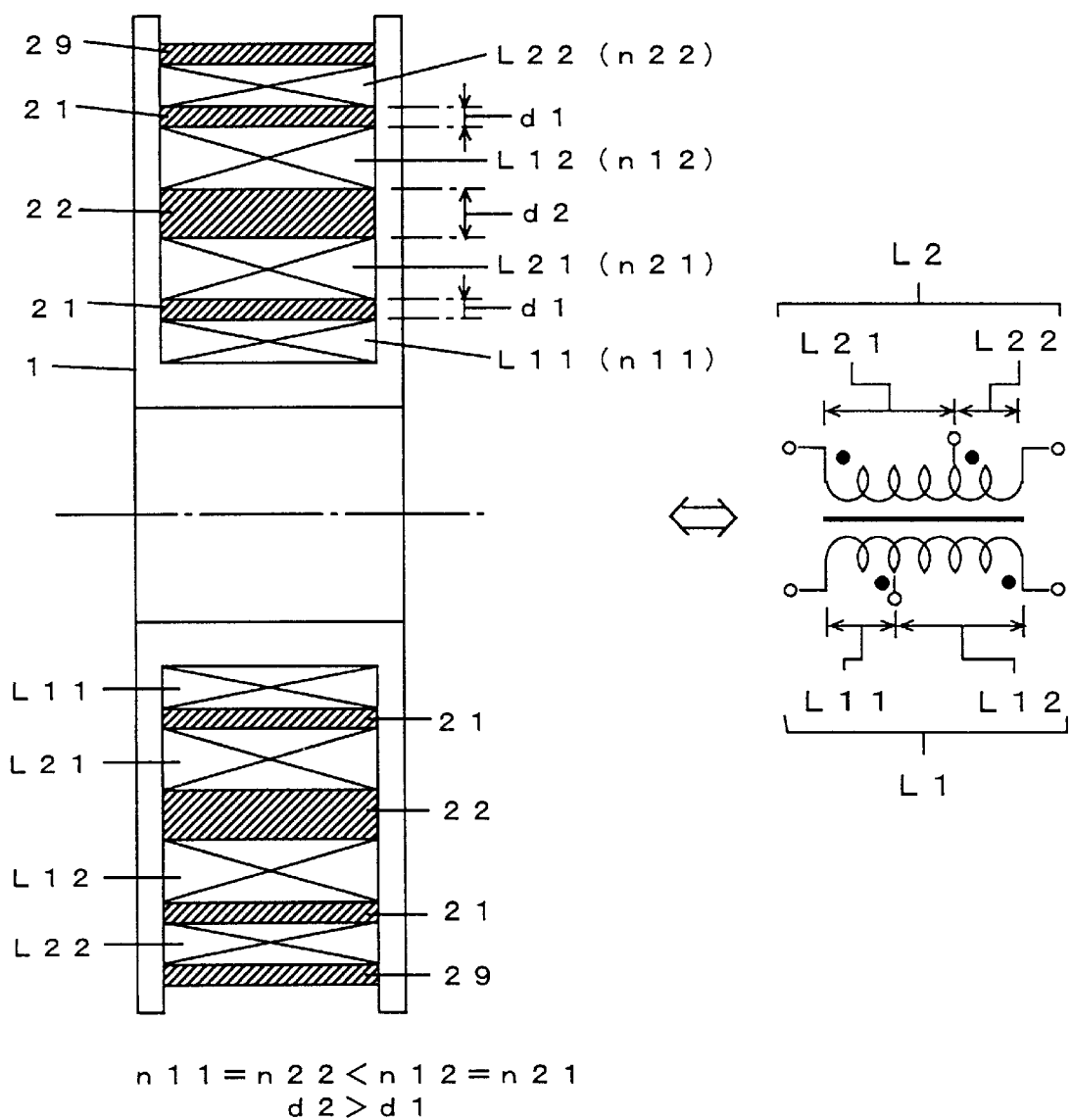
FIG. 1 is an illustration showing the preferred embodiment of a choke coil according to the present invention.

FIG. 1 is a section showing a major part of the preferred embodiment of a choke coil according to the present invention and an equivalent circuit diagram thereof.

As shown in FIG. 1, a choke coil has a pair of coils L1 and L2 having a winding ratio of 1:1. A pair of coils L1 and L2 are respectively wound in stacking manner on one coil bobbin (spool) 1. Namely, the first and second coils L1 and L2 are respectively divided into a first coil segment L11, a second coil segment L12 and a first coil segment L21, a second coil segments respectively having fractions of predetermined turns n1 and n2 (n1=n2) of the first and second coils. The first coil segment L11 of the first coil L1, the first coil segment L21 of the second coil L2, the second coil segment L12 of the first coil L1 and the second coil segment L22 of the second coil L2 are wound from inside to outside in sequential order in stacking. Between respectively adjacent coil segments L11, L21, L12 and L22, intermediate insulation layers 21, 22 and 21 are interposed. Outermost side of the coil is covered with the insulation layer 29.

Here, total number of turn of winding (n11+n12) of the first and second coil segments L11 and L12 forming the first coil L1 and total number of turn of winding (n21+n22) of the first and second coil segments L21 and L22 forming the second coil L2 are mutually (n11+n12=n21+n22). By this, a coil pair L1 and L2 having winding ratio of 1:1 is formed. However, all of winding numbers n11, n12, n21 and n22 of respective coil segments L11, L12, L21 and L22 are not the same as each other i.e., (n11=n12=n21=n22), but are differentiated according to predetermined rules per coils L1 and L2.

Namely, in the first coil L1, the winding number n11 of the first coil segment L11 and the winding number n12 of the second coil segment L12 are set for establishing n11<n12. The winding number n21 of the first coil segment L21 and the winding number n22 of the second coil segment L22 are set for establishing n21>n22.

At the same time, the winding number n11 of the first coil segment L11 of the first coil L1 and the winding number n22 of the second coil segment L22 of the second coil L2 are set to be the same as each other (n11=n22). Since the winding ratio of the first and second coils L1 and L2 is 1:1, the winding number n12 of the second coil segment L12 of the first coil L1 and the winding number n21 of the first coil segment L21 of the second coil L2 are set to be the same as each other (n12=n21).

Namely, the first and second coils L1 and L2 having winding ratio of 1:1 are wound divided into two coil segments (L11, L12) and (L21, L22) with different winding numbers. The coil segments L11 and L22 having smaller winding number are arranged at innermost position and outermost position. The coil segments L12 and L21 having greater winding number are arranged at intermediate layers. The first and second coil segments L11 and L12 of the first coil L1 and the first and second coil segments L21 and L22 of the second coil L2 are alternately stacked.

Here, wire wound resistances per unit winding number in respective coil segments L11, L12, L21 and L22 become greater in sequential order of L11<L21<L12<L22 depending upon difference of coil diameters on inside and outside. Winding numbers n11, n12, n21, n22 of the coil segments L11, L12, L21, L22 establish relationship of n11=n22<n12=n21.

Assuming winding resistances of the coil segments L11, L12, L21, L22 are assumed to be r11, r12, r21, r22, respectively, winding resistances R1 and R2 in the first and second coils L1 and L2 are as follows:

$$R1 = r11 + r12 \quad (1)$$

$$R2 = r21 + r22 \quad (2)$$

The resistances r11, r22 and r21, r12 are resistances caused by the same winding numbers, resistance differences Δ1, Δ2 are caused due to difference of coil diameters.

$$r11 + \Delta1 = r22 \quad (3)$$

$$r21 + \Delta2 = r12 \quad (4)$$

Expressing the winding resistances R1 and R2 of the coils L1 and L2 using the resistance differences Δ1, Δ2, the following expressions are established.

$$R1 = r11 + (r21 + \Delta2) \quad (5)$$

$$R2 = r21 + (r11 + \Delta1) \quad (6)$$

Here, Δ1 and Δ2 are determined by products of resistance difference per unit winding number and winding number. Namely, Δ1 is determined by a product of the resistance difference per unit winding number between the coil segments L11 and L12. Likewise, Δ2 is determined by a product of the resistance difference per unit winding number between the coil segments L21 and L22. The resistance differences per unit winding number are the same between the coil segments L11 and L22 and between the coil segments L12 and L21. Accordingly, winding numbers (n11, n22) of the coil segments L11 and L22 and winding numbers (n12, n21) of the coil segments L12, L21 are mutually differentiated (n1=n22<n12=n21). In conjunction therewith, by appropriately selecting respective winding numbers (n11, n22) and (n12, n21), an optimal point where difference between Δ1, Δ2 can be zero or quite small, can be established. By this, difference of winding resistance value between the first and second coils L1 and L2 can be reduced in the extent that no problem is encountered for practical use.

Furthermore, concerning resistance difference per unit winding between the coil segments L11 and L22 and resistance difference per unit winding between the coil segments L12, L21, optimizing point for making differences of Δ1 and Δ2 small or minimum can be more precisely set by setting thickness d2 of the intermediate insulation layer 22 interposed between the coil segments L12 and L21 and thickness d1 of the other insulation layers 21 interposed between the coil segments L11 and L21 and between the coil segments L12 and L22 independently of each other. The thickness d of the insulation layer 2 may be formed by an insulation tape to arbitrarily and easily set by thickness and winding number of the insulation tape.

With the construction set forth above, the difference of winding resistance (R1−R2) between the coils L1 and L2 can be reduced to be less than or equal to at least 4%.

As set forth above, the shown embodiment of the choke coil can significantly reduce the difference of winding resistance due to difference of winding diameter which has been otherwise defect of divided winding structure even in the coaxially stacking type divided winding structure which can reduce both of leakage inductance and line capacity. Furthermore, since the coaxially stacking type divided winding structure does not require the partitioning wall portion dividing the spool portion, the shape of the coil bobbin can be relatively simple. In addition, simultaneous winding operation of two coils which makes winding operation complicated, can be eliminated. By this, it becomes possible to obtain the choke coil which can make the difference of the winding resistance between the coils small, provide sufficient attenuation of unbalance with respect to the ground, be superior in workability of winding operation, and reduce the leakage inductance and line capacity.

Figure 2:
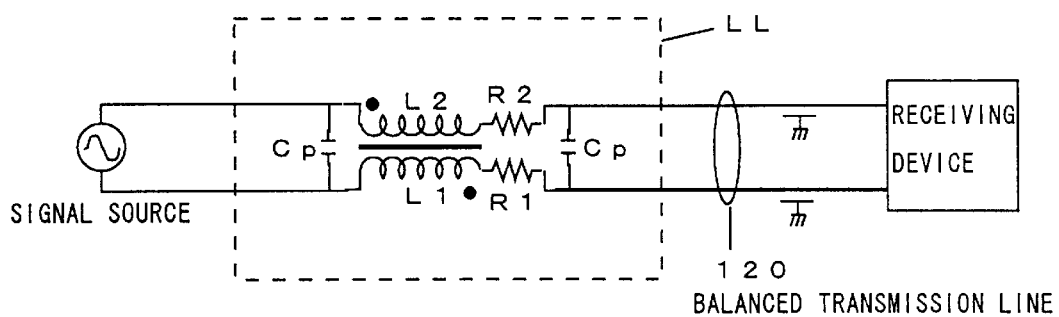
FIG. 2 is a circuit diagram showing a use of the preferred embodiment of the choke coil according to the present invention.

FIG. 2 is a circuit diagram showing an example of use of the choke coil set forth above.

In FIG. 2, the choke coil LL is inserted in a transmission line balanced with respect to the ground, such as telephone circuit or the like to demonstrate attenuation of unbalance with respect to the ground for restricting adverse effect of potential leakage in the grounding layer and loop noise to be generated between the transmission line and the ground. In order to ensure unbalance attenuation operation, it becomes necessary to make the leakage inductance between the coils small, and in conjunction therewith, to reduce the difference of the winding resistance R1 and R2 parasitic on respective coils L1 and L2 as small as possible. The preferred embodiment of the choke coil set forth above can reduce both of the leakage inductance and difference of the winding resistance to be satisfactorily small, good unbalance attenuation characteristics can be attained.

Figure 3:
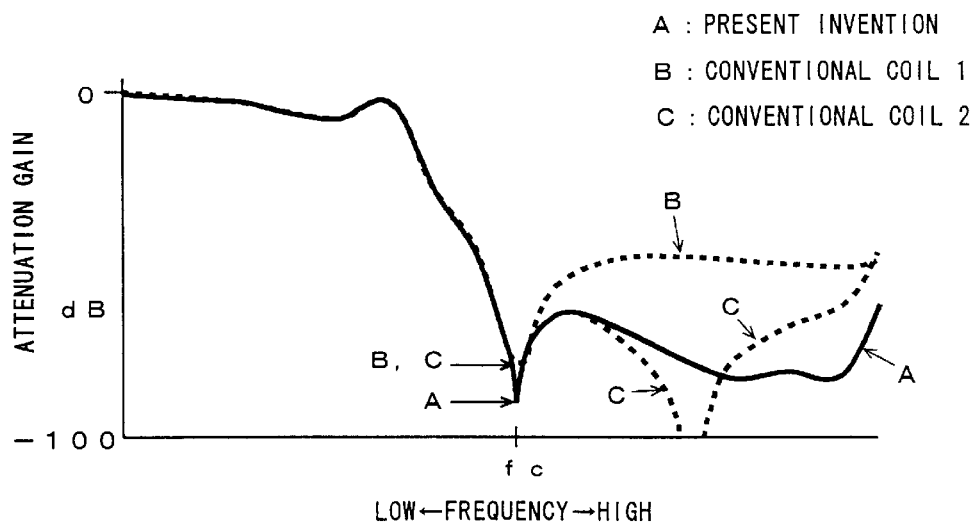
FIG. 3 is a graph showing an example of characteristics of an LPF constructed with employing the preferred embodiment of the choke coil according to the present invention.
Figure 4A:
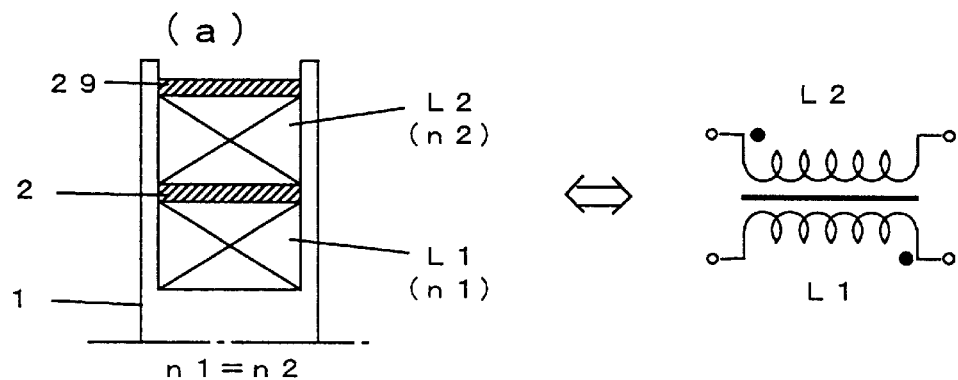
FIGS. 4A to 4F are illustration showing various constructions of the conventional choke coils.
Figure 4B:
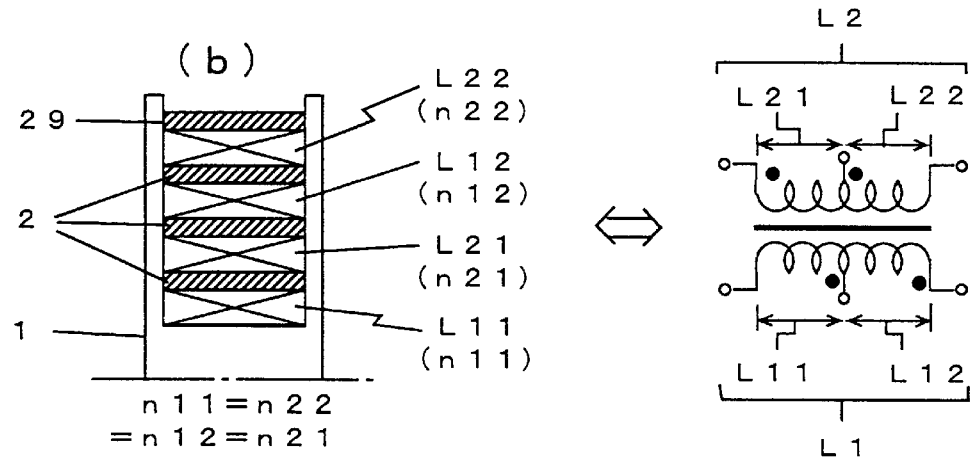
Figure 4C:
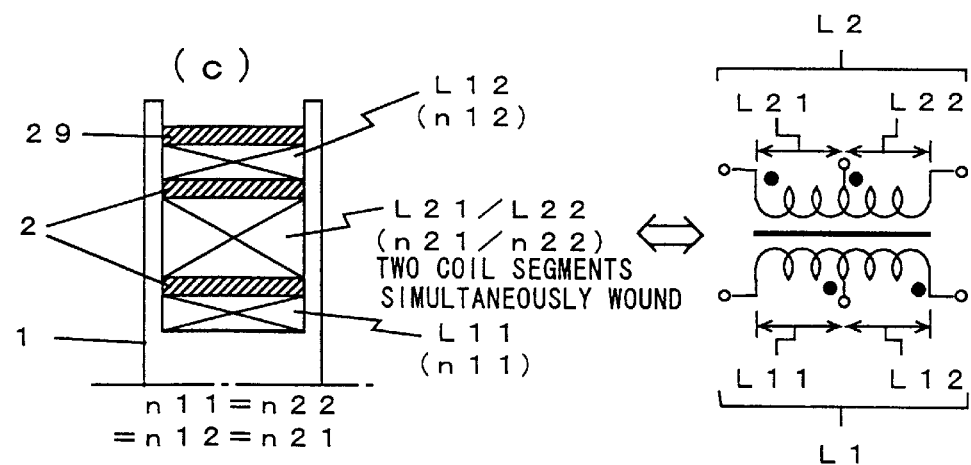
Figure 4D:
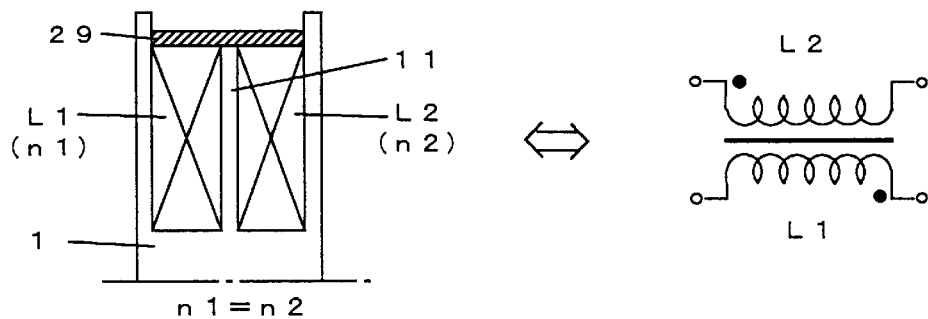
Figure 4E:
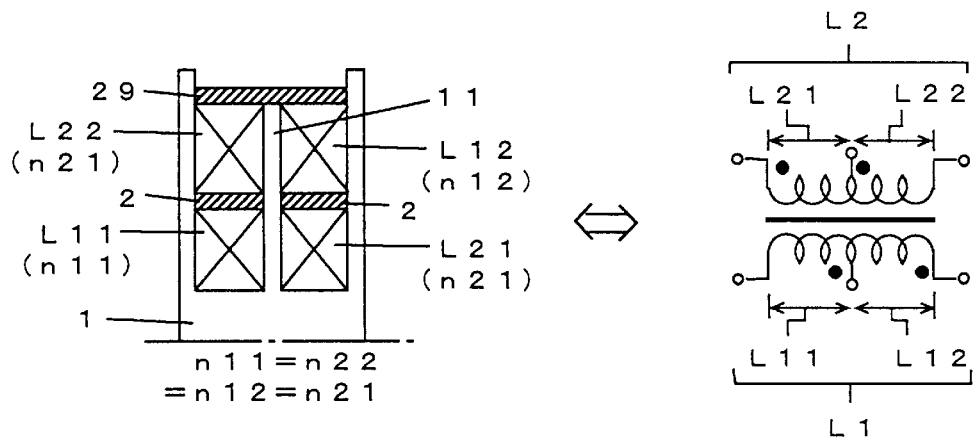
Figure 4F:
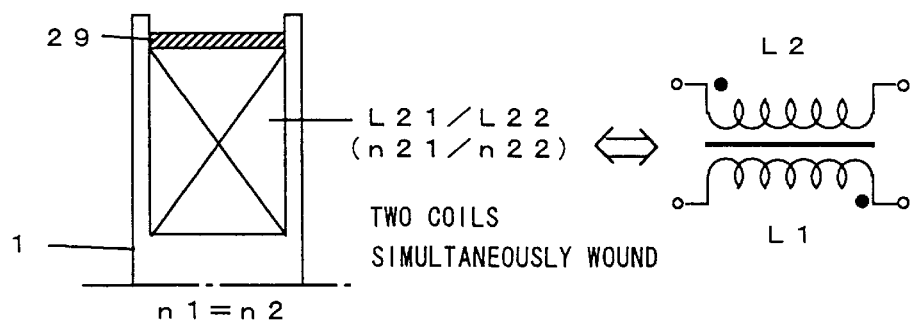

FIG. 3 shows an example of characteristics of an LPF constructed employing the preferred embodiment of the choke coil according to the present invention.

In FIG. 3, a characteristic curve A represents a frequency transmission characteristics employing the choke coil of the present invention, a characteristic curves B and C respectively show frequency transmission characteristics of the LPF employing the conventional choke coils. Respective LPFs are designed to have the same blocking frequency fc, whereas the present invention maintains transmission characteristics comparable or higher transmission characteristics in the pass frequency band (pass band) and definitely attains stable and good characteristics in the pass blocking frequency band (out of pass band) as compared to the conventional ones.

The present invention can certainly reduce difference of winding resistance between the coils having the winding ratio of 1:1 with quite simple construction simply by adjusting winding number. By this, sufficient unbalance attenuation amount with respect to the ground can be attained with simultaneously achieving superior workability in winding and satisfactory reduction of the leakage inductance and line capacity.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A choke coil including a coil pair having a winding ratio of 1:1, comprising:

first and second coils forming said coil pair, respective of said first and second coils being divided into first and second segments wound on a single spool disposing intermediate insulations layers between respectively adjacent coil segments, said first and second coil segments being stackingly wound in sequential order of said first coil segment of said first coil, said first coil segment of said second coil, said second coil segment of said first coil and said second coil segment of said second coil from inside to outside, said first coil segment of said first coil and said second coil segment of said second coil being wound in a first winding number and said second coil segment of said first coil and said first coil segment of said second coil being wound in a second winding number, said second winding number being greater than said first winding number for reducing difference of winding resistance between said first and second coils less than or equal to 4%.

2. A choke coil as set forth in claim 1, wherein a thickness of said intermediate insulation layer disposed between said first coil segment of said second coil and said second coil segment of said first coil is set adjusting the difference of winding resistance between said first and second coils less than or equal to 4%.

3. A choke coil as set forth in claim 1, wherein thicknesses of said insulation layers are set to be different from each other so as to establish the difference of winding resistance between said first and second coils less than or equal to 4%.

4. A choke coil as set forth in claim 3, wherein a thickness of an insulation layer disposed between said first coil segment of said second coil and said second coil segment of said first coil is differentiated from thicknesses of insulation layers respectively disposed between said first coil segment of said first coil and said first coil segment of said second coil and between said second coil segment of said first coil and said second coil segment of said second coil.

5. A choke coil as set forth in claim 1, wherein said intermediate insulation layer is formed by winding an insulation tape for adjusting the difference of winding resistance between said first and second coils less than or equal to 4% by thickness and/or winding number of said insulation tape.

6. A band-pass filter constructed with a common mode choke coil constructed as defined by claim 1.

* * * * *

UNITED STATES PATENT AND TRADEMARK OFFICE
CERTIFICATE OF CORRECTION

PATENT NO. : 6,617,949 B2
DATED : September 9, 2003
INVENTOR(S) : Atsushi Ishizuka et al.

It is certified that error appears in the above-identified patent and that said Letters Patent is hereby corrected as shown below:

Title page,
Item [75], Inventors, "Atsushi Ishizuka, Nagano-ken (JP)" should be -- Atsushi Ishizuka, Shizuoka-ken (JP) --; "Masami Miyamoto, Nagano-ken (JP)" should be -- Masami Miyamoto, Shizuoka-ken (JP) --; "Masami Nonaka, Nagano-ken (JP)" should be -- Masami Nonaka, Shizuoka-ken (JP) --; and "Tadashi Sato, Nagano-ken (JP)" should be -- Tadashi Sato, Shizuoka-ken (JP) --

Signed and Sealed this

Twenty-first Day of June, 2005

JON W. DUDAS
*Director of the United States Patent and Trademark Office*